(12) United States Patent
Kuo et al.

(10) Patent No.: US 6,660,641 B1
(45) Date of Patent: Dec. 9, 2003

(54) METHOD FOR FORMING CRACK RESISTANT PLANARIZING LAYER WITHIN MICROELECTRONIC FABRICATION

(75) Inventors: Chin Chen Kuo, Taipei (TW); Sheng Liang Pan, Hsinchu (TW); Yu-Kung Hsiao, Tau-Yuan (TW); Chih-Kung Chang, Hsin-Chu (TW); Fu-Tien Wong, Taoyuan (TW); Chung Sheng Hsiung, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/190,273

(22) Filed: Jul. 5, 2002

(51) Int. Cl.[7] ............................................. H01L 21/311
(52) U.S. Cl. ...................................... 438/699; 430/314
(58) Field of Search ................................ 438/699, 780, 438/725; 430/312, 314

(56) References Cited

U.S. PATENT DOCUMENTS

| | | | |
|---|---|---|---|
| 4,553,153 A | | 11/1985 | McColgin et al. |
| 4,657,629 A | * | 4/1987 | Bigelow ..................... 156/643 |
| 5,053,298 A | | 10/1991 | Park et al. |
| 5,516,625 A | * | 5/1996 | McNamara et al. ........ 430/314 |
| 5,654,202 A | | 8/1997 | Daly et al. |

\* cited by examiner

Primary Examiner—Douglas A. Wille
(74) Attorney, Agent, or Firm—Tung & Associates

(57) ABSTRACT

Within a method for forming a planarizing layer within a microelectronic fabrication, there is employed formed upon a partially photoexposed planarizing layer formed of a partially photoexposed negative photoresist material a sacrificial layer. Within the method, when sequentially: (1) stripping from the partially photoexposed planarizing layer the sacrificial layer; and (2) developing the partially photoexposed planarizing layer to form a developed planarizing layer, the developed planarizing layer is formed with enhanced planarity and diminished thickness.

15 Claims, 2 Drawing Sheets

METHOD FOR FORMING CRACK RESISTANT PLANARIZING LAYER WITHIN MICROELECTRONIC FABRICATION

BACKGROUND OF THE INVENTION

1. Field of the Invention

The present invention relates generally to methods for fabricating microelectronic fabrications. More particularly, the present invention relates to methods for forming crack resistant planarizing layers when fabricating microelectronic fabrications.

2. Description of the Related Art

Within the general art of microelectronic fabrication, there exist purely electronic microelectronic fabrications whose operation is based solely upon electrical signal storage and processing characteristics of purely electronic microelectronic devices and microelectronic circuits formed upon a microelectronic substrate. Examples of such purely electronic microelectronic fabrications typically include, but are not limited to, semiconductor integrated circuit microelectronic fabrications and ceramic substrate microelectronic fabrications. Similarly, there also exist within the general art of microelectronic fabrication microelectronic fabrications whose operation is based upon a codependent transduction, storage and/or processing of optical and electrical signals while employing optoelectronic microelectronic devices formed upon a microelectronic substrate. Examples of such optoelectronic microelectronic fabrications typically include, but are not limited to: (1) solar cell optoelectronic microelectronic fabrications; and (2) image array optoelectronic microelectronic fabrications such as but not limited to: (a) sensor image array optoelectronic microelectronic fabrications; and (b) display image array optoelectronic microelectronic fabrications.

Common to all microelectronic fabrications, whether purely electronic microelectronic fabrications or optoelectronic microelectronic fabrications, is the use of planarizing layers for purposes of providing planar surfaces upon which may be formed additional microelectronic layers and additional microelectronic structures within a microelectronic fabrication.

While planarizing layers are thus desirable in the art of microelectronic fabrication and often essential in the art of microelectronic fabrication, planarizing layers are nonetheless not entirely without problems in the art of microelectronic fabrication.

In that regard, it is often difficult in the art of microelectronic fabrication to form within microelectronic fabrications planarizing layers with enhanced planarity and diminished thicknesses.

It is thus desirable in the art of microelectronic fabrication to form within microelectronic fabrications planarizing layers with enhanced planarity and diminished thicknesses.

It is towards the foregoing object that the present invention is directed.

Various applications of planarizing layers within microelectronic fabrications have been disclosed within in the art of microelectronic fabrication. Included in particular among the applications, but not limiting among the applications, are applications related to color filter image array optoelectronic microelectronic fabrications. Specific examples of such applications are disclosed within: (1) McColgin et al., in U.S. Pat. No. 4,553,153; (2) Park et al., in U.S. Pat. No. 5,053,298; and (3) Daly et al., in U.S. Pat. No. 5,654,202, the disclosures of which are incorporated herein fully by reference.

Desirable in the art of microelectronic fabrication are additional methods for forming within microelectronic fabrications planarizing layers with enhanced planarity and diminished thicknesses.

It is towards the foregoing object that the present invention is directed.

SUMMARY OF THE INVENTION

A first object of the invention is to provide a method for forming a planarizing layer within a microelectronic fabrication.

A second object of the present invention is to provide a method in accord with the first object of the present invention, wherein the planarizing layer is formed with enhanced planarity and diminished thickness.

In accord with the objects of the present invention, there is provided by the present invention a method for fabricating a microelectronic fabrication.

To practice the method of the present invention, there is first provided a substrate having formed thereover a topographic feature. There is then formed upon the substrate including the topographic feature a planarizing layer formed from a negative photoresist planarizing material. There is then partially photoexposed the planarizing layer to form a partially photoexposed planarizing layer. There is then formed upon the partially photoexposed planarizing layer a sacrificial layer. Finally, there is then sequentially: (1) stripped the sacrificial layer from the partially photoexposed planarizing layer; and (2) developed the partially photoexposed planarizing layer to form a developed planarizing layer planarizing the topographic feature.

The present invention provides a method for forming a planarizing layer within a microelectronic fabrication, wherein the planarizing layer is formed with enhanced planarity and diminished thickness.

The present invention realizes the foregoing object by employing within a microelectronic fabrication, formed upon a partially photoexposed planarizing layer formed of a partially photoexposed negative photoresist material, a sacrificial layer such that when sequentially: (1) stripping from the partially photoexposed planarizing layer the sacrificial layer; and (2) developing the partially photoexposed planarizing layer to form a developed planarizing layer, the developed planarizing layer is formed with enhanced planarity and diminished thickness.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a planarizing layer within a microelectronic fabrication, wherein the planarizing layer is formed with enhanced planarity and diminished thickness.

The present invention realizes the foregoing object by employing within a microelectronic fabrication, formed upon a partially photoexposed planarizing layer formed of a partially photoexposed negative photoresist material, a sacrificial layer, such that when sequentially: (1) stripping from the partially photoexposed planarizing layer the sacrificial layer; and (2) developing the partially photoexposed planarizing layer to form a developed planarizing layer, the developed planarizing layer is formed with enhanced planarity and diminished thickness.

Although the preferred embodiment of the present invention illustrates the present invention within the context of forming within a color filter sensor image array optoelectronic microelectronic fabrication a planarizing layer with enhanced planarity and diminished thickness, the present invention is not intended to be so limited. Rather, the present invention may be employed for forming, with enhanced planarity and diminished thicknesses, planarizing layers within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. Within the present invention, a topographic feature which may be planarized by a planarizing layer formed in accord with the present invention with enhanced planarity and diminished thickness may be formed from a microelectronic material selected from the group including but not limited to microelectronic conductor materials, microelectronic semiconductor materials, microelectronic dielectric materials and laminated thereof.

Referring now to FIG. 1 to FIG. 7, there is shown a series of schematic cross-sectional diagrams illustrating the results of progressive stages of forming, in accord with a preferred embodiment of the present invention, a color filter sensor image array optoelectronic microelectronic fabrication having formed therein a planarizing layer formed in accord with the present invention.

Figure 1:
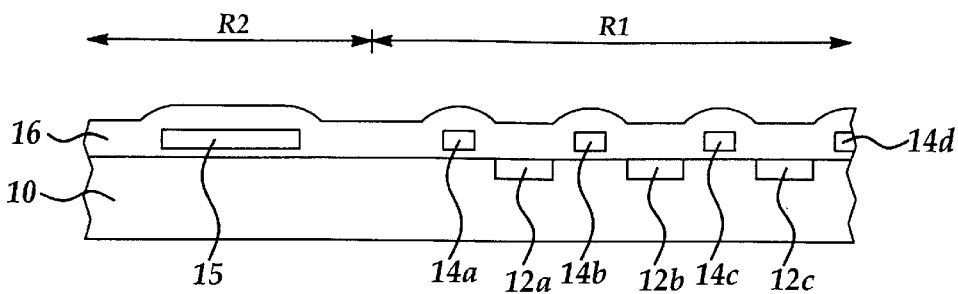
FIG. 1, FIG. 2, FIG. 3, FIG. 4, FIG. 5, FIG. 6 and FIG. 7 show a series of schematic cross-sectional diagrams illustrating the results of progressive stages of forming, in accord with a preferred embodiment of the present invention, a color filter sensor image array optoelectronic microelectronic fabrication having formed therein a planarizing layer formed in accord with the present invention.

Shown in FIG. 1 is a schematic cross-sectional diagram of the color filter sensor image array optoelectronic microelectronic fabrication at an earlier stage in its fabrication in accord with the preferred embodiment of the present invention.

Shown in FIG. 1, in a first instance, is a substrate 10 having formed therein a series of photoactive regions 12a, 12b and 12c. As is further illustrated within the schematic cross-sectional diagram of FIG. 1, the substrate 10 is further divided into an active region R1 having formed therein the photoactive regions 12a, 12b and 12c, and a peripheral region R2 not having formed therein the photoactive regions 12a, 12b and 12c.

Within the preferred embodiment of the present invention with respect to the substrate 10 and the series of photoactive regions 12a, 12b and 12c, the substrate 10 is typically and preferably a silicon semiconductor substrate, and the series of photoactive regions 12a, 12b and 12c is typically and preferably a series of photodiode regions within the silicon semiconductor substrate. However, the present invention may provide value with respect to an optoelectronic microelectronic fabrication which employs a substrate other than a silicon semiconductor substrate, where the substrate has formed therein, thereupon or thereover photoactive regions formed of other than photodiodes. Typically and preferably, the silicon semiconductor substrate will have an N– or P– doping concentration, while the photodiode photoactive regions 12a, 12b and 12c will typically and preferably have a complementary P+ or N+ doping concentration.

Although FIG. 1 illustrates the substrate 10 as a flat substrate having the photoactive regions 12a, 12b and 12c formed contiguously therein, it is understood by a person skilled in the art that the photoactive regions 12a, 12b and 12c may also be formed topographically within the substrate 10, and the substrate 10 may also have formed therein additional appropriate layers and structures, such as but not limited to channel stop layers and structures, as are needed to adequately isolate the photoactive regions 12a, 12b and 12c within the substrate 10.

Shown also within FIG. 1, and formed upon the substrate 10 including the series of photoactive regions 12a, 12b and 12c, is a blanket dielectric passivation layer 16 which has formed therein over the active region R1 of the substrate 10, and at locations alternating with the series of photo active regions 12a, 12b and 12c a series of patterned conductor layers 14a, 14b, 14c and 14d. Similarly, the blanket dielectric passivation layer 16 also has formed therein within the peripheral region R2 of the substrate 10 a bond pad 15. Within the preferred embodiment of the present invention, the series of patterned conductor layers 14a, 14b, 14c and 14d, as well as the bond pad 15, may typically and preferably be formed incident to patterning of a single blanket conductor layer, although such is not a requirement within the present invention.

Within the preferred embodiment of the present invention, the series of patterned conductor layers 14a, 14b, 14c and 14d typically serves as a first directional charge collection array (within a bidirectional array which is not otherwise illustrated) within the color filter sensor image array optoelectronic microelectronics fabrication whose schematic cross-sectional diagram is illustrated in FIG. 1. Similarly, within the preferred embodiment of the present invention, the bond pad 15 is one of a series of bond pads which is ultimately connected to various of the series of patterned conductor layers 14a, 14b, 14c or 14d for purposes of extracting and sensing charge therefrom incident to illumination of the series of photoactive regions 12a, 12b and 12c. Finally, within the preferred embodiment of the present invention with respect to the blanket dielectric passivation layer 16, the blanket dielectric passivation layer 16 serves to separate the patterned conductor layers 14a, 14b, 14c and 14d, and the bond pad 15, from each other and from the substrate 10. As is illustrated within the schematic cross-sectional diagram of FIG. 1, the series of patterned conductor layers 14a, 14b, 14c and 14d, induce within the blanket dielectric passivation layer 16 a series of topographic features (i.e., composite patterned conductor layer and dielectric layers features) for which planarization is desired.

Within the preferred embodiment of the present invention, the bond pad 15, and typically and preferably also the patterned conductor layers 14a, 14b, 14c and 14d are each formed of an aluminum or aluminum alloy (having an aluminum content of greater than about 98 weight percent aluminum) conductor material. Typically and preferably each of the patterned conductor layers 14a, 14b, 14c and 14d and the bond pad 15 is formed to a thickness of from about 5000 to about 13000 angstroms. Typically and preferably, each of the patterned conductor layers 14a, 14b, 14c and 14d has a minimum linewidth of from about 0.35 to about 0.15 microns while the bond pad 15 has a bidirectional linewidth (i.e., defining a plan view area) of from about 70 to about 100 microns.

Within the preferred embodiment of the present invention with respect to the blanket dielectric passivation layer 16, the blanket dielectric passivation layer 16 is typically and preferably formed of a dielectric passivation material which is transparent to incident electromagnetic radiation whose detection and classification the color filter sensor image array optoelectronic microelectronic fabrication whose schematic cross-sectional diagram is illustrated in FIG. 1 is designed to detect and classify. Typically and preferably, the blanket dielectric passivation layer 16 is formed of a passivation material selected from the group including but not limited to silicon oxide passivation materials, silicon nitride passivation materials, silicon oxynitride passivation materials and composites thereof, having incorporated therein the series of patterned conductor layers 14a, 14b, 14c and 14d, and the bond pad 15. Typically and preferably, the blanket dielectric passivation layer 16 is formed to a thickness of from about 1000 to about 1500 angstroms, having formed therein peak-to-trough topographic feature variations of from about 500 to about 1100 angstroms, which are desired to be planarized.

Figure 2:
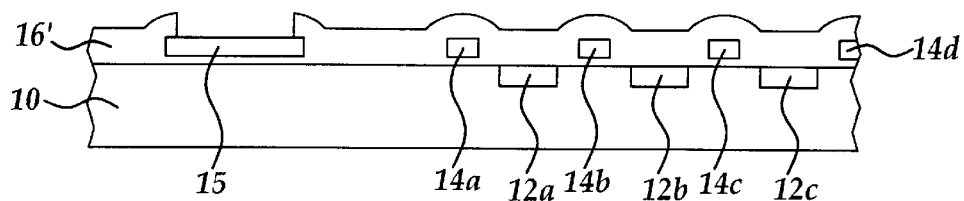

Referring now to FIG. 2, there is shown a schematic cross-sectional diagram illustrating the results of further processing of the color filter sensor image array optoelectronic microelectronic fabrication whose schematic cross-sectional diagram is illustrated is FIG. 1.

Shown in FIG. 2 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 1, but wherein the blanket dielectric passivation layer 16 has been etched to form an etched blanket dielectric passivation layer 16' having formed therein an aperture which leaves exposed a portion of the bond pad 15.

Within the preferred embodiment of the present invention, the blanket dielectric passivation layer 16 as illustrated within the schematic cross-sectional diagram of FIG. 1 may be etched to form the etched blanket dielectric passivation layer 16' as illustrated within the schematic cross-sectional diagram of FIG. 2 while employing photolithographic and etch methods as are otherwise generally conventional in the art of microelectronic fabrication. Typically and preferably, such etch methods provide the aperture of bidirectional linewidth which leaves covered a series of edges of the bond pad 15.

Figure 3:
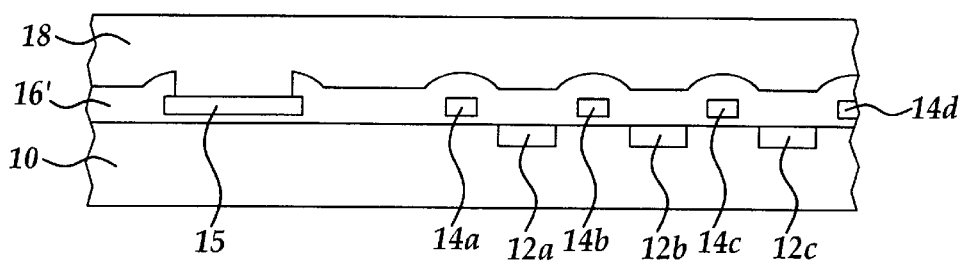

Referring now to FIG. 3, there is shown a schematic cross-sectional diagram illustrating the results of further processing of the color filter sensor image array optoelectronic microelectronic fabrication whose schematic cross-sectional diagram is illustrated in FIG. 2.

Shown in FIG. 3 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 2, but wherein there has been formed upon exposed portions of the bond pad 15 and the etched blanket dielectric passivation layer 16' a blanket planarizing layer 18.

Within the preferred embodiment of the present invention, the blanket planarizing layer 18 is formed from a negative photoresist planarizing material. The negative photoresist planarizing material may be of a variety as is conventional or unconventional in the art of microelectronic fabrication. Typically, conventional negative photoresist planarizing materials include, but are not limited to, CT-3050L manufactured by Fuji-Olim, negative photoresist planarizing materials. Typically and preferably, the blanket planarizing layer 18 is formed to a thickness of from about 5000 to about 25000 angstroms.

Figure 4:
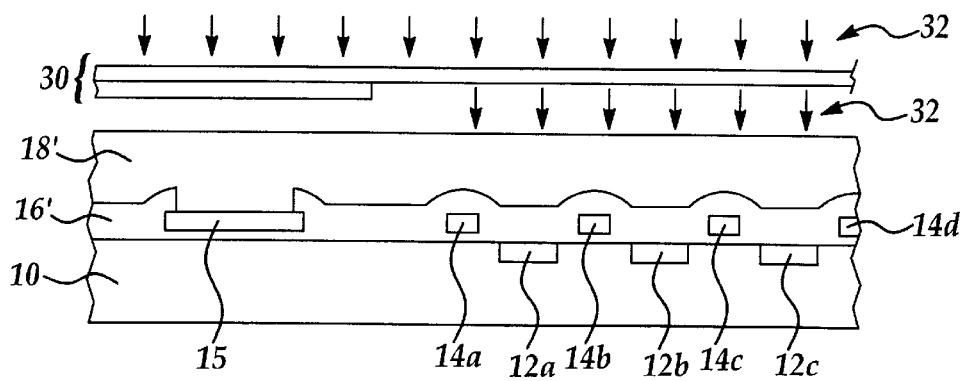

Referring now to FIG. 4, there is shown a schematic cross-sectional diagram illustrating the results of further processing of the color filter sensor image array optoelectronic microelectronic fabrication whose schematic cross-sectional diagram is illustrated in FIG. 3.

Shown in FIG. 4 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 3, but wherein the blanket planarizing layer 18 has been partially photoexposed, while employing a photomask 30 in conjunction with a dose of actinic radiation 32, to provide a partially photoxposed planarizing layer 18'.

Within the preferred embodiment of the present invention, the planarizing layer 18 is partially photoexposed to form the partially photoexcposed planarizing layer 18' while employing the dose of actinic radiation 32 which is typically and preferably from about 30 to about 60 percent of a dose (as determined via intensity and exposure time) needed to fully vertically photoexpose the blanket planarizing layer 18. For example and without limitation, if a dose of actinic radiation needed to fully vertically photoexpose a blanket planarizing layer is about 130 millijoules per square centimeter surface area a dose to provide a partially photoexposed blanket planarizing layer is from about 40 to about 80 millijoules per square centimeter surface area.

As is further understood by a person skilled in the art, while the preferred embodiment of the present invention illustrates the present invention within the context of a masked photoexposure of the blanket planarizing layer 18 with a sufficiently limited dose of actinic radiation 32 to provide the partially photoexposed blanket planarizing layer 18', the present invention also contemplates an unmasked photoexposure of a blanket planarizing layer with a sufficiently limited dose of actinic radiation to form a photoexposed blanket planarizing layer.

Figure 5:
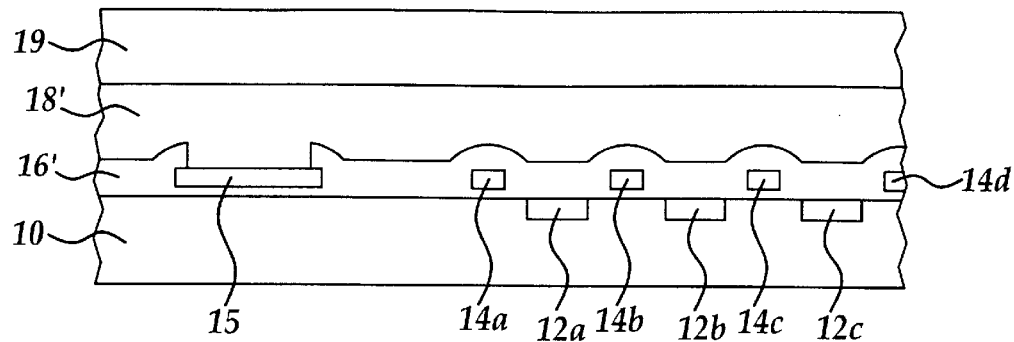

Referring now to FIG. 5, there is shown a schematic cross-sectional diagram illustrating the results of further processing of the color filter sensor image array optoelectronic microelectronic fabrication whose schematic cross-sectional diagram is illustrated in FIG. 4.

Shown in FIG. 5 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 4, but wherein there is formed upon the partially photoexposed blanket planarizing layer 18' a sacrificial layer 19.

Within the preferred embodiment of the present invention, the sacrificial layer 19 has a greater solubility within a developer employed for developing the partially photoexposed blanket planarizing layer 18' than does the partially photoexposed planarizing layer 18'. Typically and preferably, the sacrificial layer is formed of the same negative photoresist planarizing material as is employed for forming the blanket planarizing layer 18, but the blanket sacrificial layer 19 is not photoexposed, either partially or completely. Typically and preferably, the sacrificial layer 19 is formed to a thickness of from about 5000 to about 25000 angstroms.

Figure 6:
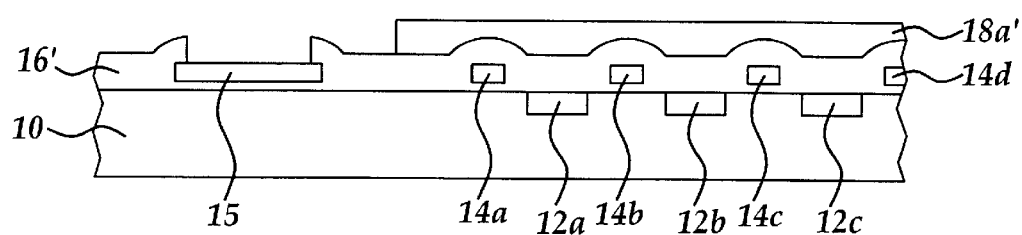

Referring now to FIG. 6, there is shown a schematic cross-sectional diagram illustrating the results of further processing of the color filter sensor image array optoelectronic microelectronic fabrication whose schematic cross-sectional diagram is illustrated in FIG. 5.

Shown in FIG. 6 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 5, but wherein: (1) the sacrificial layer 19 has been stripped from the partially photoexposed blanket planarizing layer 18'; and (2) the partially photoexposed blanket planarizing layer 18' has been developed to form a patterned planarizing layer 18a'.

Within the preferred embodiment of the present invention, the sacrificial layer 19 is stripped from the partially photoexposed planarizing layer 18' and the partially photoexposed planarizing layer 18' is developed to form the patterned planarizing layer 18a' while employing a developer as is otherwise conventional in the art of microelectronic fabrication and appropriate to the material from which is formed the blanket planarizing layer 18. Typically and preferably, under circumstances where the blanket planarizing layer 18 is formed to a thickness of from about 8000 to about 16000 angstroms and photoexposed with the actinic radiation dose as described above, the patterned planarizing layer 18a' is formed to a diminished thickness of from about 3000 to about 8000 angstroms when developed in a developer such, as but not limited to, CT-3050L manufactured by Fuji-Olim, negative photoresist developer.

As is understood by a person skilled in the art, by employing within the present invention the blanket sacrificial layer 19 as a protective layer when developing the partially photoexposed blanket planarizing layer 18' to form the patterned planarizing layer 18a', there is provided for less intrusion of the developer and a more uniform etching within the developer of the partially photoexposed blanket planarizing layer 18' when forming therefrom the patterned planarizing layer 18a'. Thus, the patterned planarizing layer 18a' is formed with enhanced planarity as evidenced by diminished cracks and wrinkles, as well as with diminished thickness.

Figure 7:
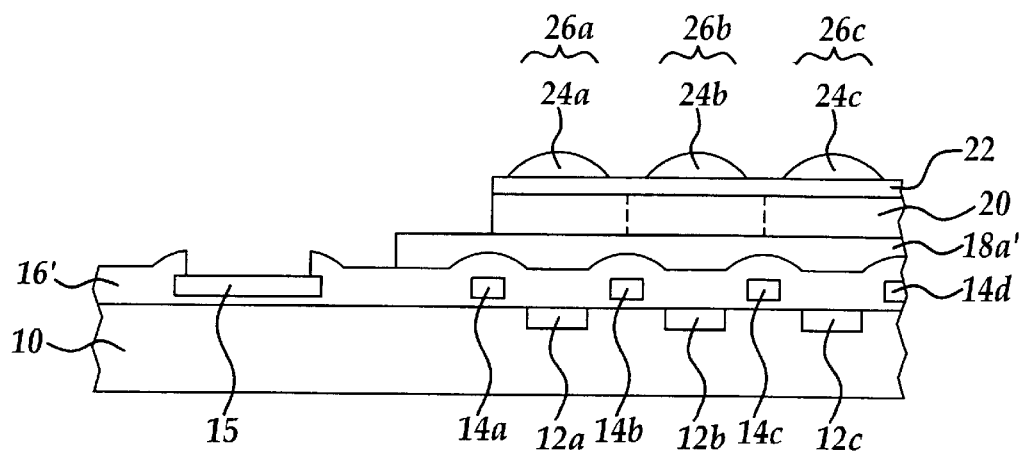

Referring now to FIG. 7, there is shown a schematic cross-sectional diagram illustrating the results of further processing of the color filter sensor image array optoelectronic microelectronic fabrication whose schematic cross-sectional diagram is illustrated in FIG. 6.

Shown in FIG. 7 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 6, but wherein there is formed upon or over the patterned planarizing layer 18a' a series of layers comprising: (1) a color filter layer 20 formed upon the patterned planarizing layer 18a'; (2) a spacer layer 22 formed upon the color filter layer 20; and (3) a series of microlens layers 24a, 24b and 24c formed upon the spacer layer 22 and registered with the individual photoactive regions 12a, 12b and 12c within the active region R1 of the substrate 10 as defined within FIG. 1.

Within the preferred embodiment of the present invention, each of the foregoing layers may be formed employing methods and materials as are conventional in the art of color filter sensor image array optoelectronic microelectronic fabrication.

Although not specifically illustrated within the schematic cross-sectional diagram of FIG. 1, the color filter layer 20 typically and preferably has several patterned color layers incorporated therein, as is conventional in the art of color filter sensor image array optoelectronic: microelectronic fabrication. Typically and preferably, the color filter layer 20 is formed while employing an organic polymer binder material having incorporated therein separate sections of color filter materials which encompass either the three primary colors of red, blue and green or the three complementary primary colors of cyan, magenta and yellow.

In addition, typically and preferably, the spacer layer 22 is preferably formed of a material which is intended to separate the series of patterned microlens 24a, 24b and 24c from the color filter layer 20. Similarly with the blanket dielectric passivation layer 16 and the planarizing layer 18, the spacer layer 22 is preferably formed of a spacer material which is transparent to a spectrum of incident electromagnetic radiation whose detection and classification is effected by the color filter sensor image array optoelectronic microelectronic fabrication whose schematic cross-sectional diagram is illustrated in FIG. 1. Also similarly with the blanket dielectric passivation layer 16, the blanket spacer layer 22 is also preferably formed from a spacer material selected from the group including but not limited to silicon oxide materials, silicon nitride materials, silicon oxynitride materials, as well as photoresist spin-on-polymer (SOP) materials, and composites thereof.

Finally, with respect to the series of patterned microlens layers 24a, 24b and 24c, the series of patterned microlens layers 24a, 24b and 24c is formed of a patterned photoresist material of appropriate optical properties, where the patterned photoresist layer is thermally reflowed to form the series of patterned microlens layers 24a, 24b and 24c of convex shape, as illustrated within the schematic cross-sectional diagram of the color filter sensor image array optoelectronic microelectronic fabrication whose schematic cross-sectional diagram is illustrated in FIG. 4. For the preferred embodiment of the present invention, the series of patterned photoresist layers from which is formed the series of patterned microlens layers 24a, 24b and 24c is preferably formed of a positive photoresist material, although negative photoresist materials and non-photoresist materials may also be employed, presuming appropriate optical properties and thermal reflow characteristics. Typically and preferably, the patterned positive photoresist layers from which are formed the patterned microlens layers 24a, 24b and 24c are formed as cylindrical patterned positive photoresist layers of diameter from about 5 to about 12 microns and thickness from about 15000 to about 30000 angstroms.

Although not specifically illustrated within the schematic cross-sectional diagram of FIG. 4, each of the patterned microlens layers 24a, 24b and 24c focuses incident electromagnetic radiation upon a corresponding one of the photoactive regions 12a, 12b and 12c. In so doing, it is typically desirable to control both the thicknesses and indicies of refraction of each of the blanket passivation layer 16, the planarizing layer 18, the color filter layer 20, the spacer layer 22 and the patterned microlens layers 24a, 24b and 24c so that incident electromagnetic radiation is optimally focused upon each of the photoactive regions 12a, 12b and 12c. Thus, most optimally within the preferred embodiment of the present invention: (1) the blanket passivation layer 16 is formed of a silicon nitride material of index of refraction of about 1.4 to about 1.6 and thickness about 16000 to about 22000 angstroms upon the substrate 10; (2) the planarizing layer 18 is formed of a negative photoresist material of index of refraction about 1.4 to about 1.6 and thickness about 3000 to about 8000 angstroms upon the blanket passivation layer 16; (3) the color filter layer 20 is formed of an organic polymer binder material of thickness about 10000 to about 20000 angstroms upon the blanket planarizing layer 18; (4) the spacer layer 22 is formed of a negative photoresist material of index of refraction about 1.4 to about 1.6 and thickness about 20000 to about 30000 angstroms formed upon the blanket color filter layer 20; and (5) the patterned microlens layers 24a, 24b and 24c, in addition to the above parameters, are formed with an index of refraction of from about 1.5 to about 1.7 upon the spacer layer 22.

As is illustrated within the schematic cross-sectional diagram of FIG. 1, each portion of: the color filter sensor image array optoelectronic microelectronic fabrication whose schematic cross-sectional diagram is illustrated in FIG. 1 which includes a patterned microlens layer 24a, 24b or 24c, in conjunction with a corresponding photoactive region 12a, 12b and 12c of the substrate 10 comprises a pixel element 26a, 26b or 26c.

As is understood by a person skilled in the art, the preferred embodiment of the present invention is illustrative of the present invention rather than limiting of the present invention. Revisions and modifications may be made to methods, materials, structures and dimensions which are employed to form a color filter sensor image array optoelectronic microelectronic fabrication in accord with the preferred embodiment of the present invention while still forming a microelectronic fabrication, or in particular an optoelectronic microelectronic fabrication, in accord with the present invention, further in accord with the appended claims.

What is claimed is:

1. A method for fabricating a microelectronic fabrication comprising:
    providing a substrate having formed thereover a topographic feature;
    forming upon the substrate including the topographic feature a planarizing layer formed from a negative photoresist planarizing material;
    partially photoexposing the planarizing layer to form a partially photoexposed planarizing layer;
    forming upon the partially photoexposed planarizing layer a sacrificial layer; and
    sequentially:
        stripping the sacrificial layer from the partially photoexposed planarizing layer; and
        developing the partially photoexposed planarizing layer to form a developed planarizing layer planarizing the topographic feature.

2. The method of claim 1 wherein the substrate is employed within a microelectronic fabrication selected from the group consisting of integrated circuit microelectronic fabrications, ceramic substrate microelectronic fabrications and optoelectronic microelectronic fabrications.

3. The method of claim 1 wherein the topographic feature is formed from a microelectronic material selected from the group consisting of microelectronic conductor materials, microelectronic semiconductor materials and microelectronic dielectric materials.

4. The method of claim 1 wherein planarizing layer is formed to a thickness of from about 8000 to about 16000 angstroms.

5. The method of claim 1 wherein the sacrificial layer is formed to a thickness of from about 5000 to about 25000 angstroms.

6. The method of claim 1 wherein the developed planarizing layer is formed to a thickness of from about 3000 to about 8000 angstroms.

7. The method of claim 1 wherein the sacrificial layer is formed of the same negative photoresist planarizing material as the blanket planarizing layer, but not photoexposed.

8. The method of claim 1 wherein the sequential stripping of the sacrificial layer from the partially, photoexposed planarizing layer and developing of the partially photoexposed planarizing layer to form the developed planarizing layer planarizing the topographic feature is undertaken with a single photoresist developer material intended for developing the partially photoexposed planarizing layer.

9. A method for fabricating an image array optoelectronic microelectronic fabrication comprising:
    providing a substrate employed within an image array optoelectronic microelectronic fabrication, the substrata having formed thereover a topographic feature;
    forming upon the substrate including the topographic feature a planarizing layer formed from a negative photoresist planarizing material;
    partially photoexposing the planarizing layer to form a partially photoexposed planarizing layer;
    forming upon the partially photoexposed planarizing layer a sacrificial layer; and
    sequentially:
        stripping the sacrificial layer from the partially photoexposed planarizing layer; and
        developing the partially-photoexposed planarizing layer to form a developed planarizing layer planarizing the topographic feature.

10. The method of claim 9 wherein the topographic feature is formed from a microelectronic material selected from the group consisting of microelectronic conductor materials, microelectronic semiconductor materials and microelectronic dielectric materials.

11. The method of claim 9 wherein planarizing layer is formed to a thickness of from about 8000 to about 16000 angstroms.

12. The method of claim 9 wherein the sacrificial layer is formed to a thickness of from about 5000 to about 25000 angstroms.

13. The method of claim 9 wherein the developed planarizing layer is formed to a thickness of from about 3000 to about 8000 angstroms.

14. The method of claim 9 wherein the sacrificial layer is formed of the same negative photoresist: planarizing material as the blanket planarizing layer, but not photoexposed.

15. The method of claim 9 wherein the sequential stripping of the sacrificial layer from the partially photoexposed planarizing layer and developing of the partially photoexposed planarizing layer to form the developed planarizing layer planarizing the topographic feature is undertaken with a single photoresist developer material intended for developing the partially photoexposed planarizing layer.

* * * * *